United States Patent
Ishikura et al.

(10) Patent No.: US 7,462,880 B2
(45) Date of Patent: Dec. 9, 2008

(54) SEMICONDUCTOR LIGHT-EMITTING ELEMENT ASSEMBLY

(75) Inventors: Takuro Ishikura, Kashihara (JP); Tomihiro Ito, Niigata (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 11/882,008

(22) Filed: Jul. 30, 2007

(65) Prior Publication Data

US 2008/0048204 A1  Feb. 28, 2008

(30) Foreign Application Priority Data

Jul. 28, 2006  (JP) ............... 2006-206293

(51) Int. Cl.
*H01L 29/74* (2006.01)
(52) U.S. Cl. .................... 257/99; 257/706
(58) Field of Classification Search ............ 257/99, 257/706
See application file for complete search history.

(56) References Cited

U.S. PATENT DOCUMENTS

| | | | |
|---|---|---|---|
| 6,045,240 A * | 4/2000 | Hochstein | 362/294 |
| 6,936,855 B1 * | 8/2005 | Harrah | 257/88 |
| 7,081,645 B2 * | 7/2006 | Chen et al. | 257/99 |
| 7,161,190 B2 * | 1/2007 | Chikugawa | 257/99 |
| 7,273,987 B2 * | 9/2007 | Becker et al. | 174/260 |
| 7,296,916 B2 * | 11/2007 | Ouderkirk et al. | 362/373 |

FOREIGN PATENT DOCUMENTS

JP  11-046018  2/1999

* cited by examiner

*Primary Examiner*—Douglas M Menz
(74) *Attorney, Agent, or Firm*—Morrison & Foerster LLP

(57) ABSTRACT

A semiconductor light-emitting element assembly includes: a semiconductor light-emitting element having first and second leads, a semiconductor light-emitting element chip die-bonded to the first lead and wire-bonded to the second lead, a metal body for heat dissipation fixed to the first and second leads via an insulating adhesive layer, and a reflector fixed to the first and second leads and reflecting light from the chip; a wiring board having an opening for receiving the reflector; a heat dissipator disposed on the metal body for heat dissipation; and a fastening part for fastening the heat dissipator and the wiring board, wherein the first and second leads are fixed to the wiring board so that the reflector is received in the opening, and an interval holding part for holding an interval between the heat dissipator and the wiring board.

7 Claims, 6 Drawing Sheets

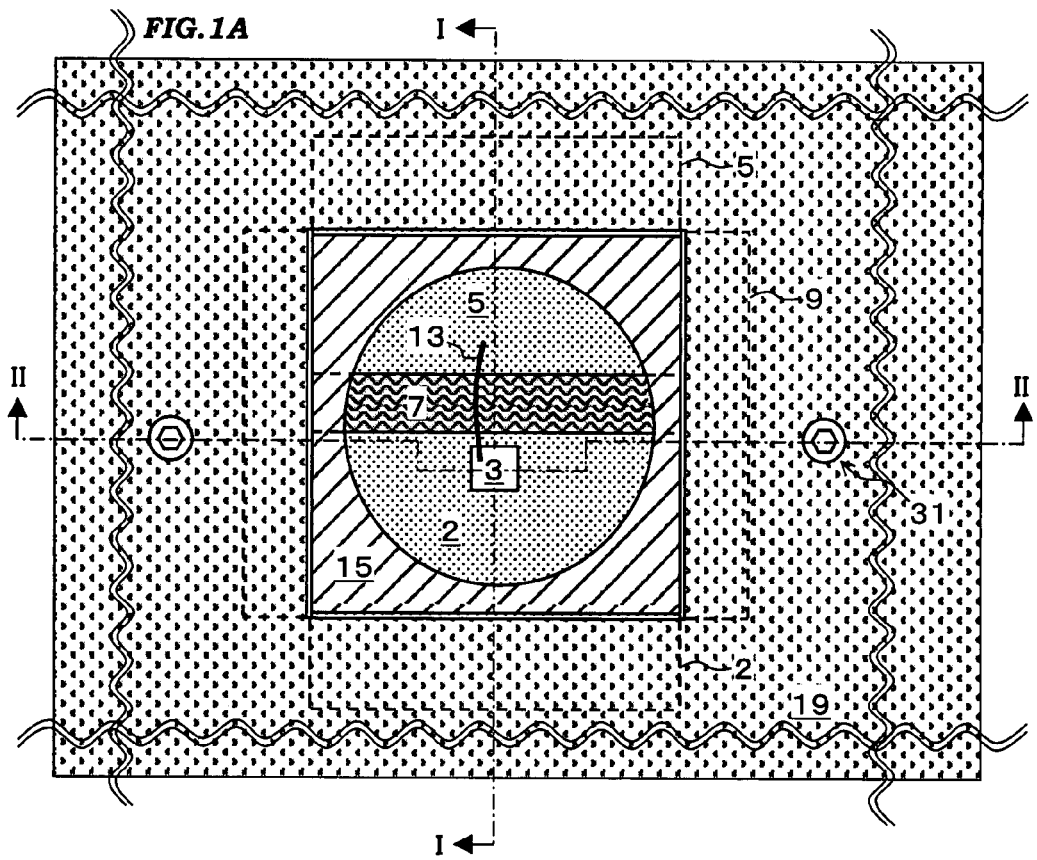
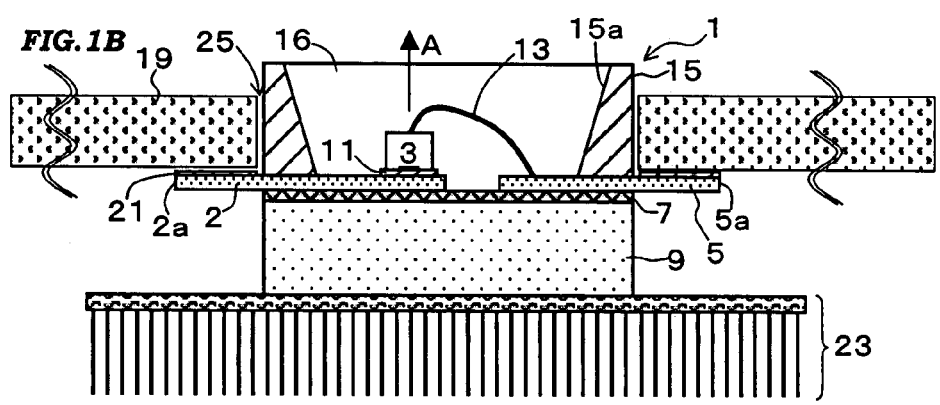
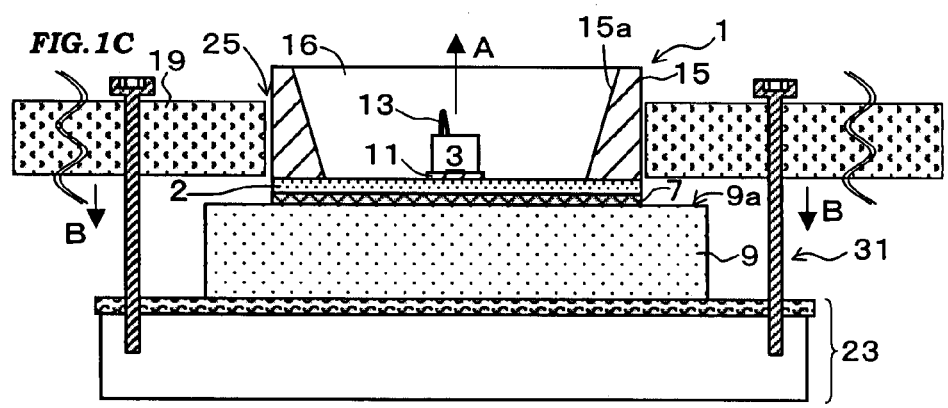

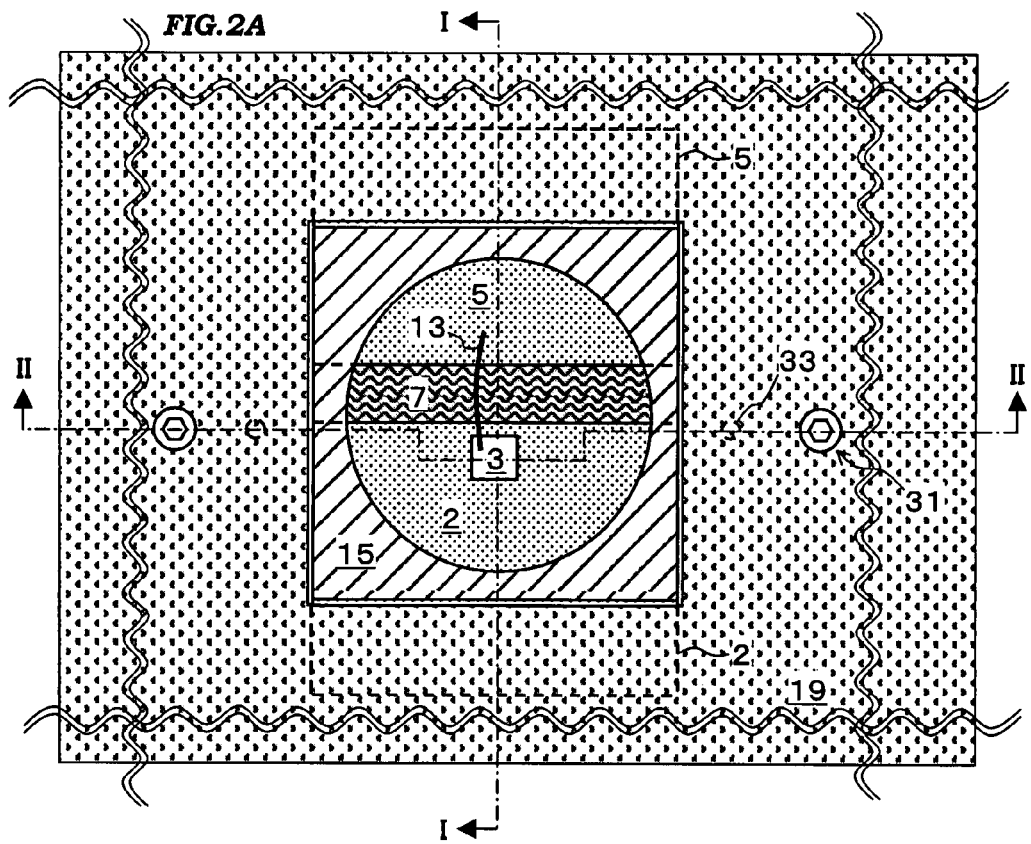
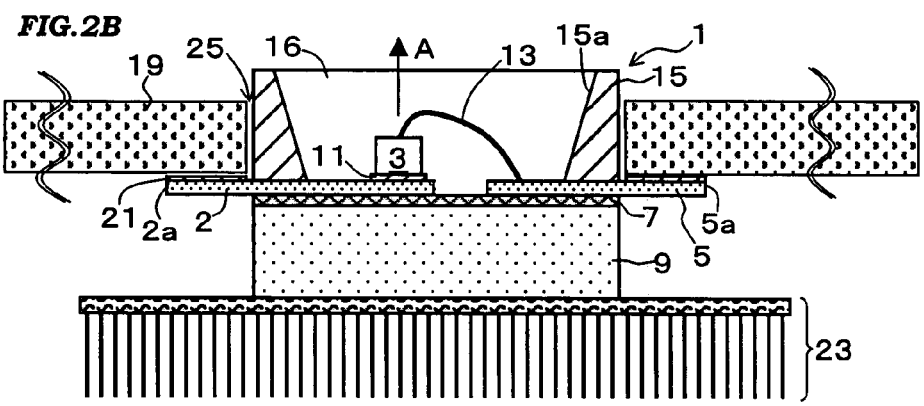
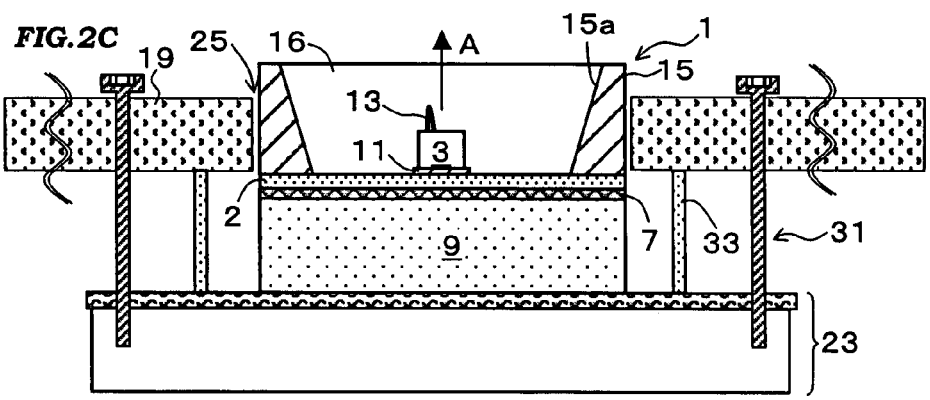

SEMICONDUCTOR LIGHT-EMITTING ELEMENT ASSEMBLY

CROSS-REFERENCE TO RELATED APPLICATION

This application is related to Japanese Patent Application No. 2006-206293 filed on Jul. 28, 2006, whose priority is claimed and the disclosure of which is incorporated by reference in its entirety.

BACKGROUND OF THE INVENTION

1. Field of the Invention

The present invention relates to a semiconductor light-emitting element assembly and, more particularly, to a semiconductor light-emitting element assembly capable of efficiently dissipating heat.

2. Description of Related Art

First, with reference to FIG. 6, a surface-mounting light-emitting diode as an example of a conventional semiconductor light-emitting element will be described (see, for example, Japanese Unexamined Patent Publication No. H11-46018).

The light-emitting diode has an insulating substrate 51, a die-bond electrode pattern 53 and a second electrode pattern 55 extending from a top surface of the insulating substrate 51 via a side face to an undersurface of the same, a light-emitting diode element 59 fixed over the die-bond electrode pattern 53 via a conductive adhesive 57, a bonding wire 61 for connecting the light-emitting diode element 59 and the second electrode pattern 55, and a translucent resin member 63 for sealing the light-emitting diode element 59 and the bonding wire 61. The light-emitting diode is mounted on a wiring board (not shown) by soldering undersurfaces of the electrode patterns 53 and 55 to lands of the wiring board.

Heat generated by the light-emitting diode element 59 is dissipated mainly via the insulating substrate 51 and the electrode patterns 53 and 55 to the wiring board.

As the temperature of the light-emitting diode element 59 increases, the luminous efficiency decreases, and the life of the light-emitting diode element 59 is also shortened. Consequently, it is desirable to efficiently remove the heat from the light-emitting diode element 59, and this is true of semiconductor light-emitting elements in general.

SUMMARY OF THE INVENTION

The present invention has been made in consideration of such circumstances, and an object of the present invention is to provide a semiconductor light-emitting element assembly with improved heat dissipation performance.

A semiconductor light-emitting element assembly according to the present invention includes: a semiconductor light-emitting element having first and second leads, a semiconductor light-emitting element chip die-bonded to the first lead and wire-bonded to the second lead, a metal body for heat dissipation fixed to the first and second leads via an insulating adhesive layer, and a reflector fixed to the first and second leads and reflecting light from the chip; a wiring board having an opening for receiving the reflector, the first and second leads being fixed to the wiring board so that the reflector is received in the opening; a heat dissipator disposed on the metal body for heat dissipation; a fastening part for fastening the heat dissipator and the wiring board; and an interval holding part provided between the heat dissipator and the wiring board, the interval holding part holding an interval between the heat dissipator and the wiring board so that the interval is equal to or longer than a predetermined distance.

According to the present invention, the metal body for heat dissipation is fixed to the first and second leads via the insulating adhesive layer. Since the heat conductivity of the metal body for heat dissipation is usually high, heat conducted from the semiconductor light-emitting element chip to the first lead passes via the insulating adhesive layer to the metal body for heat dissipation. The heat is promptly spread over the metal body for heat dissipation and released to the outside. As described above, according to the present invention, by newly providing the metal body for heat dissipation, the heat conducted from the semiconductor light-emitting element chip to the first lead does not accumulate in the first lead. Thus, heat dissipation performance can be improved.

Further, according to the present invention, the heat dissipator is disposed on the metal body for heat dissipation, and the heat dissipator and the wiring board are fastened by the fastening part. Since the heat dissipator is fastened to the wiring board, even in the case where the size of the heat dissipator is increased, the heat dissipator is reliably fixed to the wiring board. By increasing the size of the heat dissipator, the heat dissipation performance can be improved.

When the heat dissipator and the wiring board are fastened too tightly, the wiring board may be deformed. When the wiring board is deformed, there can be problems such that the first and second leads fixed to the wiring board are deformed or detached from the wiring board. In the present invention, therefore, the interval holding part for holding the interval between the heat dissipator and the wiring board so that the interval is equal to or longer than a predetermined distance is provided, thereby suppressing deformation in the wiring board caused by excessive fastening of a screw or the like.

BRIEF DESCRIPTION OF THE DRAWINGS

FIG. 1A shows a plan view of a semiconductor light-emitting element assembly of a first embodiment of the present invention, FIG. 1B shows a cross sectional view taken along line I-I of FIG. 1A, and FIG. 1C shows a cross sectional view taken along line II-II of FIG. 1A;

FIG. 2A shows a plan view of a semiconductor light-emitting element assembly of a second embodiment of the present invention, FIG. 2B shows a cross sectional view taken along line I-I of FIG. 2A, and FIG. 2C shows a cross sectional view taken along line II-II of FIG. 2A;

DESCRIPTION OF THE PREFERRED EMBODIMENTS

Figure 3A:
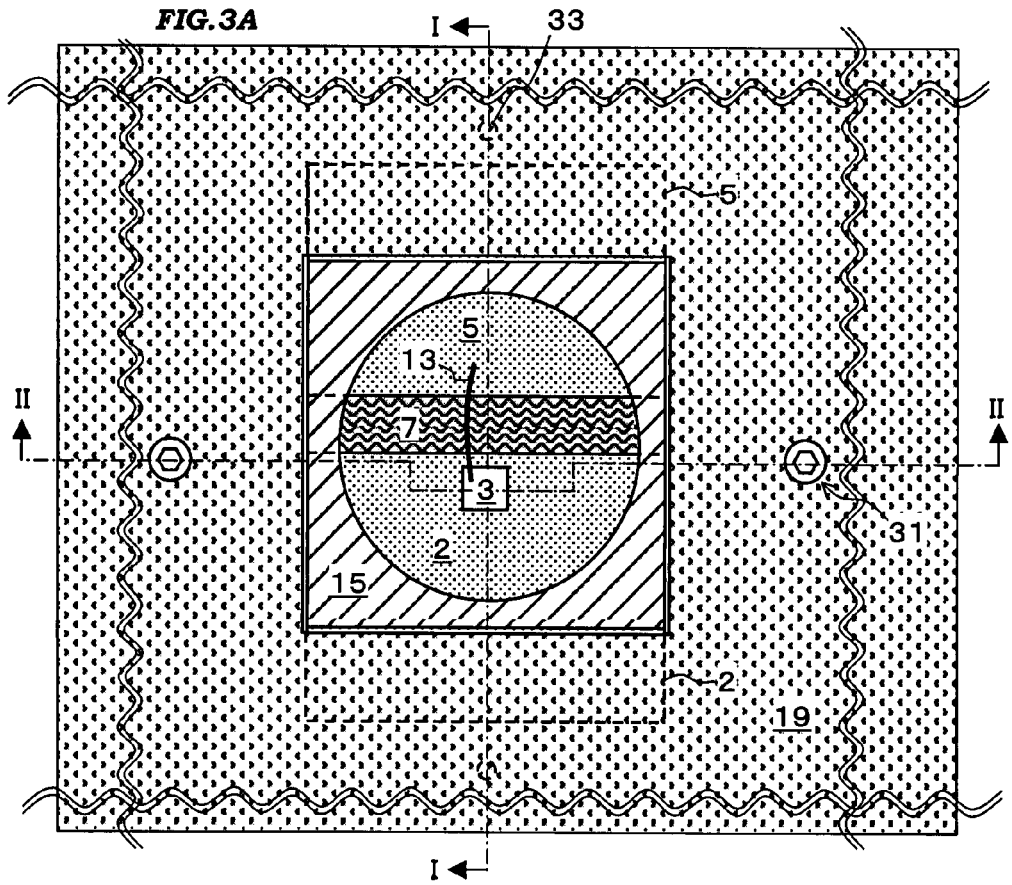
FIG. 3A shows a plan view of a semiconductor light-emitting element assembly of a third embodiment of the present invention.

Embodiments of the present invention will be described hereinbelow with reference to the drawings. The drawings are used for the sake of explanation, and the scope of the present invention is not limited to the following description and the embodiments shown in the drawings.

1. First Embodiment

A semiconductor light-emitting element assembly (hereinbelow, also referred to as "assembly") of a first embodiment of the present invention will be described with reference to FIGS. 1A to 1C. FIG. 1A shows a plan view of the assembly of the first embodiment, FIG. 1B shows a cross sectional view taken along line I-I of FIG. 1A, and FIG. 1C shows a cross sectional view taken along line II-II of FIG. 1A.

The assembly according to the present embodiment has a semiconductor light-emitting element 1, a wiring board 19, a heat dissipator 23, a fastening part 31, and an interval holding part. The components will be described hereinbelow.

(1) Semiconductor Light-Emitting Element

The semiconductor light-emitting element 1 has first and second leads 2 and 5, a semiconductor light-emitting element chip 3 which is die-bonded to the first lead 2 and is wire-bonded to the second lead 5, a metal body 9 for heat dissipation fixed to the first and second leads 2 and 5 via an insulating adhesive layer 7, and a reflector 15 fixed on the first and second leads 2 and 5 and reflecting light from the chip 3.

The chip 3 is die-bonded to the first lead 2 via a conductive adhesive layer 11. The chip 3 is wire-bonded to the second lead 5 via a bonding wire 13.

The reflector 15 for reflecting light from the chip 3 is fixed on the first and second leads 2 and 5. The reflector 15 reflects light from the chip 3 by its reflection surface 15a. The space inside the reflection surface 15a of the reflector 15 is filled with a transparent resin 16 for protecting the chip 3 and the bonding wire 13. The first and second leads 2 and 5 extend to their tips 2a and 5a perpendicularly to the light outgoing direction (arrow A) of the chip 3. The first and second leads 2 and 5 extend in opposite directions on the same straight line. The first and second leads 2 and 5 may be bent or curved unless they come into contact with the metal body 9 for heat dissipation or the like to get short-circuited.

The chip 3 is a light-emitting diode (LED) chip or the like. The thickness of the insulating adhesive layer 7 is preferably about 20 to 100 μm. As long as insulating properties are assured, the insulating adhesive layer 7 may be thinner than the above thickness. The insulating adhesive layer 7 is an insulating adhesive sheet or the like. The metal body for heat dissipation is a plate of a metal having high heat conductivity such as aluminum.

In the present embodiment, the metal body 9 for heat dissipation is fixed to the first and second leads 2 and 5 via the insulating adhesive layer 7. Since the heat conductivity of the metal body 9 for heat dissipation is usually high, heat conducted from the chip 3 to the first lead 2 passes via the insulating adhesive layer 7 to the metal body 9 for heat dissipation. The heat is promptly spread over the metal body 9 for heat dissipation and released to the outside. The heat generated in the chip 3 is smoothly conducted to the metal body 9 for heat dissipation despite of the existence of the insulating adhesive layer 7, as the insulating adhesive layer 7 is generally thin. The insulting adhesive layer 7 can easily be made thin when an insulating adhesive sheet is employed. This is because no short circuit occurs even when the leads 2 and 5 and the metal body 9 for heat dissipation are bonded to each other by pressurizing them, if the insulating adhesive sheet is employed. When they are bonded to each other only with an adhesive, there is a risk that pressure is applied non-uniformly and short circuit occurs in a certain area. In the present embodiment, the metal body 9 for heat dissipation is provided, so that the heat transmitted from the chip 3 to the first lead 2 does not accumulate in the first lead 2. Thus, heat dissipation performance is high.

(2) Wiring Board and Heat Dissipator

The wiring board 19 has an opening 25 for receiving the reflector 15. The heat dissipator 23 is disposed on the metal body 9 for heat dissipation. The first and second leads 2 and 5 are fixed to the wiring board 19 so that the reflector 15 is received in the opening 25. The first and second leads 2 and 5 are fixed to the wiring board 19 via a solder layer 21. At portions for fixing the first and second leads 2 and 5 in the wiring board 19, lands for fixing the first and second leads 2 and 5 are formed.

The number of semiconductor light-emitting elements 1 attached to the wiring board 19 may be one or more. Two or more semiconductor light-emitting elements may be arranged, for example, in matrix form. When the number of semiconductor light-emitting elements 1 is two or more, the heat dissipator 23 and a fastening part and an interval holding part which will be described later can be provided for each of the semiconductor light-emitting elements 1.

The heat dissipator 23 may be shared by a plurality of semiconductor light-emitting elements 1. In this case, it is preferable to provide the fastening part and the interval holding part for each of the semiconductor light-emitting elements 1.

The heat dissipator 23 is a cooling fin, a water cooler, or the like. The heat dissipator 23 may be in indirect contact with the metal body 9 for heat dissipation via a bonding layer made of solder, adhesive, or the like, or in direct contact with the metal body 9 for heat dissipation. With regards to opposite surfaces of the heat dissipator 23 and the metal body 9 for heat dissipation, it is preferable that the heat dissipator 23 has a surface area larger than that of the metal body 9 for heat dissipation because the larger the heat dissipator 23 is, the more the heat dissipation improves.

The assembly according to the present embodiment can be manufactured by preliminarily forming the opening 25 in the wiring board 19 and soldering the first and second leads 2 and 5 to the wiring board 19 in a state where the reflector 15 is fitted in the opening 25. In the assembly according to the present embodiment, the heat generated in the chip 3 is dissipated to the wiring board 19 via the first lead 2 and, in addition, dissipated also from the metal body 9 for heat dissipation. Thus, heat dissipation performance is high. The heat dissipation performance of the heat dissipator 23 is further improved by disposing the heat dissipator 23 on the metal body 9 for heat dissipation.

Further, since the first and second leads 2 and 5 extend in the direction perpendicular to the arrow A, the first and second leads 2 and 5 are fixed to the wiring board 19 over the whole surface facing the wiring board 19. By the configuration, the contact area between the first lead 2 and the wiring board 19 is increased and the heat dissipation performance is even higher.

(3) Fastening Part and Interval Holding Part The heat dissipator 23 and the wiring board 19 are fastened by the fastening part 31. Between the heat dissipator 23 and the wiring board 19, an interval holding part is provided, that holds the interval between the heat dissipator 23 and the wiring board 19 so that the interval is equal to or longer than a predetermined distance. In the present embodiment, the interval holding part is formed of an extension part 9a of the metal body 9 for heat dissipation formed by extending the metal body 9 for heat dissipation in the direction (the direction of the straight line II-II in FIG. 1A) orthogonal to the direction (the direction of the straight line I-I in FIG. 1A) in which the first and second leads 2 and 5 extend.

The configuration of the fastening part 31 is not limited as long as it can fasten the heat dissipator 23 and the wiring board 19. For example, in the case where a tap is formed in the heat dissipator 23, the fastening part 31 is formed by a combination of a bolt and the tap of the dissipator. In the case where a tap is not formed in the heat dissipator 23, the fastening part 31 is formed by a combination of a bolt and a nut. FIG. 1C shows a case where taps are formed in the heat dissipator 23, and the fastening part 31 is formed by a combination of a bolt (hexagon socket head cap screw) and the tap in the heat dissipator.

The number and the mounting position of the fastening part 31 are not limited. Preferably, two or more fastening parts 31 are provided to reliably fix the heat dissipator 23. In the case where the number of the fastening parts 31 is two, preferably, the two fastening parts 31 are disposed at the positions to be point symmetrical with respect to the center of the semiconductor light-emitting element 1. In such a manner, the heat dissipator 23 is fixed more reliably. Further, to reduce deformation of the first and second leads 2 and 5, more preferably, the two fastening parts 31 are disposed so as to be point-symmetrical with respect to the center of the semiconductor light-emitting element 1 and line-symmetrical with respect to a straight line parallel with the direction in which the first and second leads 2 and 5 extend and passing the center of the semiconductor light-emitting element 1.

When the heat dissipator 23 and the wiring board 19 are fastened too tightly by the fastening part 31, there can be problems such that the wiring board 19 is deformed in the direction of the arrow B in FIG. 1C and the first and second leads 2 and 5 fixed to the wiring board 19 are deformed or detached from the wiring board. In the present embodiment, however, when the wiring board 19 is deformed to a certain degree, the wiring board 19 comes into contact with the extension part 9a of the metal body 9 for heat dissipation and is not further deformed. Consequently, deformation of the first and second leads 2 and 5 caused by the deformation of the wiring board 19 is suppressed, and occurrence of the problem is suppressed.

2. Second Embodiment

With reference to FIGS. 2A to 2C, a semiconductor light-emitting element assembly according to a second embodiment of the present invention will be described. FIG. 2A shows a plan view of the assembly according to the second embodiment, FIG. 2B shows a cross sectional view taken along line I-I of FIG. 2A, and FIG. 2C shows a cross sectional view taken along line II-II of FIG. 2A.

The assembly according to the second embodiment is similar to that of the first embodiment except for the configuration of the interval holding part. In the second embodiment, the interval holding part is a spacer 33.

In the present embodiment, the interval between the heat dissipator 23 and the wiring board 19 is held by the spacer 33. Consequently, even in the case where the heat dissipator 23 and the wiring board 19 are fastened too tightly by the fastening part 31, deformation of the first and second leads 2 and 5 is suppressed.

The position of disposing the spacer 33 is not limited. For example, as shown in FIG. 2A, the spacer 33 is disposed between the fastening part 31 and the metal body 9 for heat dissipation. When the spacer 33 is disposed at such a position, the deformation in the wiring board 19 caused by fastening by the fastening part 31 does not easily spread to the first and second leads 2 and 5, so that deformation of the first and second leads 2 and 5 can be further suppressed.

The number of the spacer 33 is not limited and may be one or more. As shown in FIGS. 2A and 2C, in the case where the heat dissipator 23 and the wiring board 19 are fastened by two fastening parts 31, the number of the spacers 33 is preferably two or more. Each of the spacers 33 is preferably disposed between each fastening part 31 and the metal body 9 for heat dissipation.

3. Third Embodiment

Figure 3B:
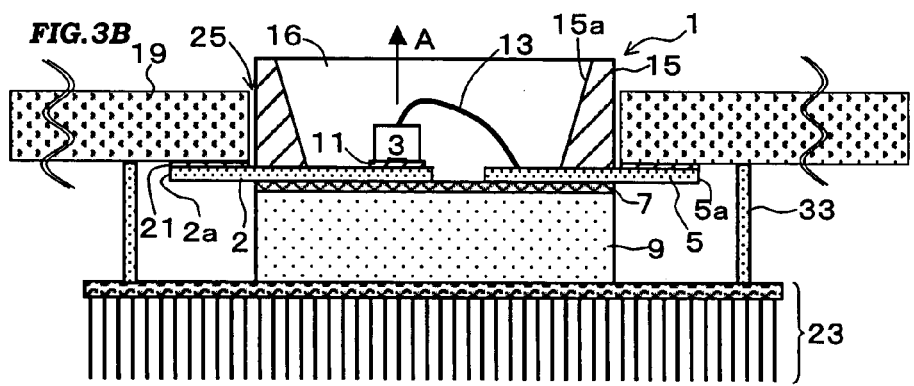
FIG. 3B shows a cross sectional view taken along line I-I of FIG. 3A.
Figure 3C:
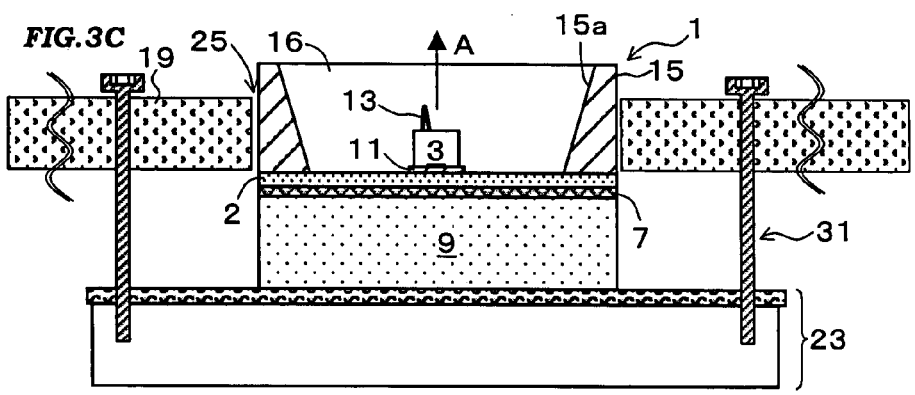
FIG. 3C shows a cross sectional view taken along line II-II of FIG. 3A.

With reference to FIGS. 3A to 3C, a semiconductor light-emitting element assembly according to a third embodiment of the present invention will be described. FIG. 3A shows a plan view of the assembly according to the third embodiment, FIG. 3B shows a cross sectional view taken along line I-I of FIG. 3A, and FIG. 3C shows a cross sectional view taken along line II-II of FIG. 3A.

The assembly according to the third embodiment is similar to that of the second embodiment except for the disposing position of the spacer 33. In the third embodiment, the number of the spacers 33 is two. The two spacers 33 are disposed on extended lines in the directions of extension of the first and second leads 2 and 5. Also in the case where the spacers 33 are disposed at such positions, deformation of the first and second leads 2 and 5 can be suppressed.

4. Fourth Embodiment

Figure 4A:
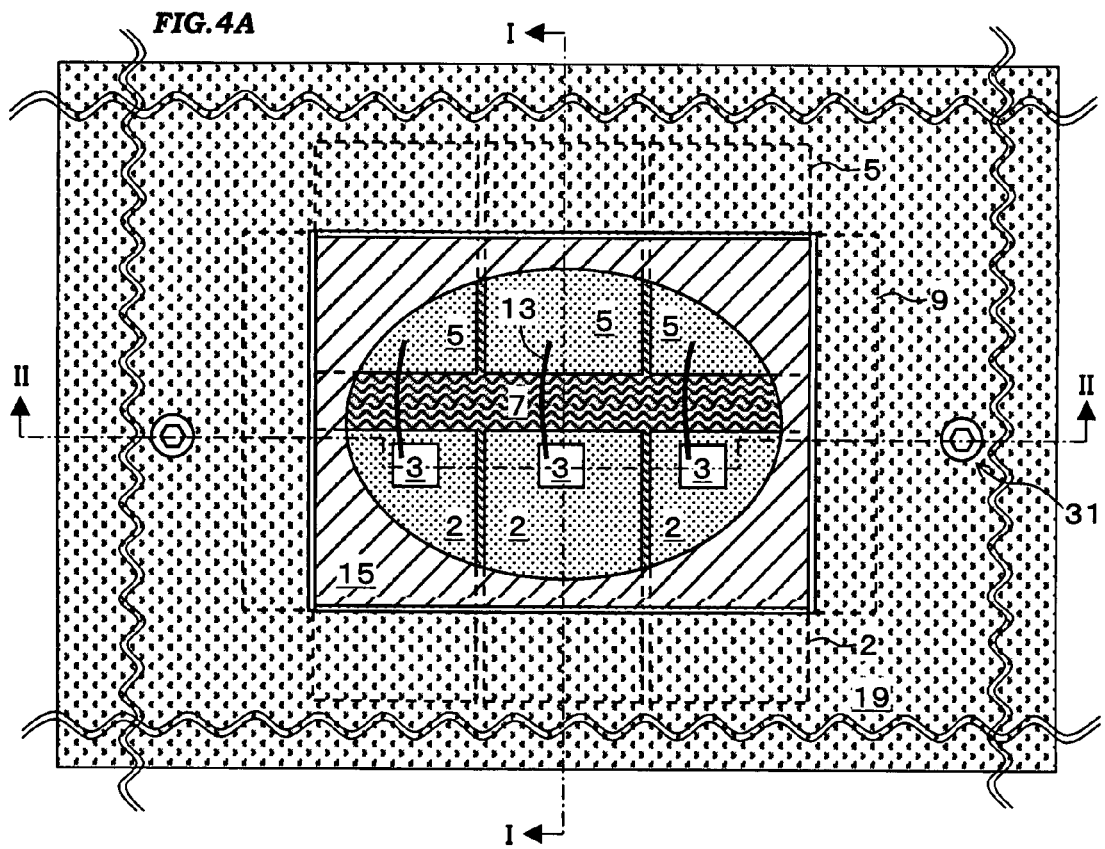
FIG. 4A shows a plan view of a semiconductor light-emitting element assembly of a fourth embodiment of the present invention.
Figure 4B:
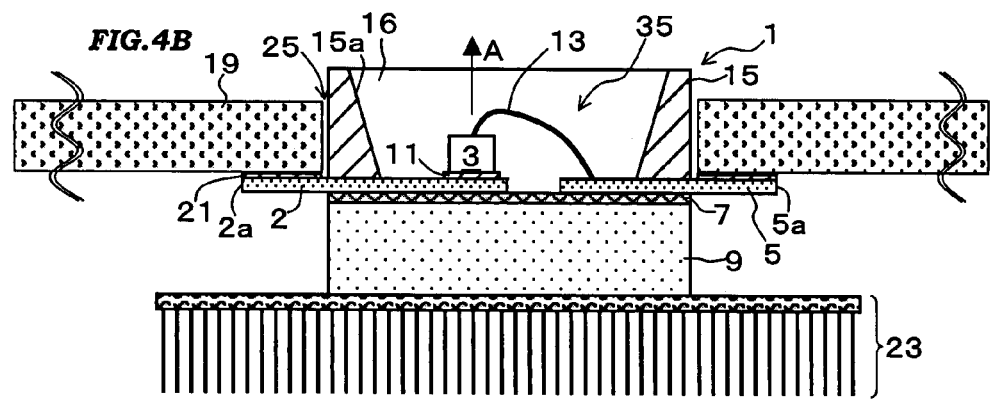
FIG. 4B shows a cross sectional view taken along line I-I of FIG. 4A.
Figure 4C:
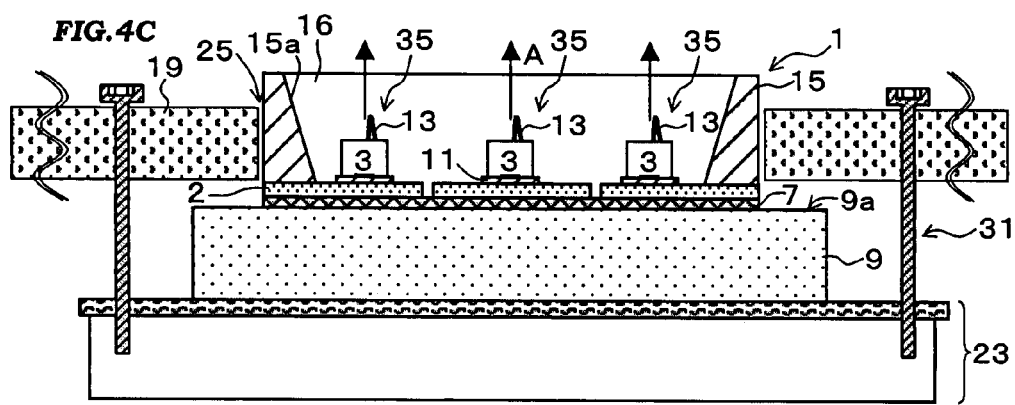
FIG. 4C shows a cross sectional view taken along line II-II of FIG. 4A.

With reference to FIGS. 4A to 4C, a semiconductor light-emitting element assembly of a fourth embodiment according to the present invention will be described. FIG. 4A shows a plan view of the assembly according to the fourth embodiment, FIG. 4B shows a cross sectional view taken along line I-I of FIG. 4A, and FIG. 4C shows a cross sectional view taken along line II-II of FIG. 4A.

The assembly according to the fourth embodiment is similar to that of the first embodiment except for the configuration of the semiconductor light-emitting element 1. In the fourth embodiment, the semiconductor light-emitting element 1 has a plurality of light-emitting modules 35. Each of the light-emitting modules 35 is formed of the first and second leads 2 and 5 and the semiconductor light-emitting element chip 3 die-bonded to the first lead 2 and wire-bonded to the second lead 5. The plurality of light-emitting modules 35 are arranged along the direction orthogonal to the direction in which the first and second leads 2 and 5 extend.

When the semiconductor light-emitting element 1 has a plurality of light-emitting modules 35, the total heat generation amount of the semiconductor light-emitting element 1 is large. Consequently, it is important to dissipate the heat. In the fourth embodiment, a relatively large heat dissipator 23 is used and the heat dissipator 23 and the wiring board 19 are fastened by the fastening part 31, thereby realizing high heat dissipation performance.

5. Method of Manufacturing Semiconductor Light-Emitting Element Assembly

An embodiment of a method of manufacturing a semiconductor light-emitting element assembly as shown in FIGS. 1A to 1C will be described with reference to FIGS. 5A to 5E. FIGS. 5A to 5E show cross sectional views corresponding to FIG. 1B and illustrate processes of manufacturing the semiconductor light-emitting element assembly according to the present embodiment.

5-1. Manufacturing Process of Semiconductor Light-Emitting Element

First, a semiconductor light-emitting element included in the semiconductor light-emitting element assembly is manufactured. The various processes for manufacturing the semiconductor light-emitting element will be described below.

(1) Reflector Forming Process

Figure 5A:
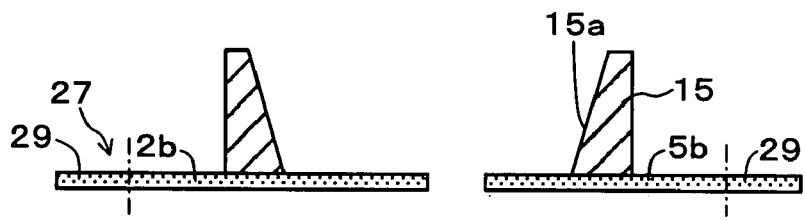
FIGS. 5A to 5E show cross sectional views corresponding to FIG. 1B and illustrate manufacturing processes of the semiconductor light-emitting element assembly of the first embodiment of the present invention.

First, the reflector 15 having the reflection surface 15a is formed on a lead frame 27 having first and second lead parts 2b and 5b for a semiconductor light-emitting element chip, thereby obtaining the structure shown in FIG. 5A. The reflector 15 can be obtained by forming a resin layer having an opening in a tapered shape by transfer molding and forming the reflection surface 15a by depositing a metal having high reflectance for visible light such as aluminum or silver on the inner face of the opening. The material of the resin layer is not limited. For example, a material obtained by mixing epoxy resin with fillers (such as silica) can be used. When a white resin containing titanium oxide is used as the material of the resin layer, the tapered surface can be used as it is as the reflection surface. Thus, the process of depositing aluminum or the like can be omitted.

In the case of forming the reflection layer by transfer molding, in order to firmly fix a lead and the reflection layer to each other, for example, it is preferable to form a through hole in the lead and extend the resin for forming the reflector to the back side of the lead. The through hole may be formed in a portion where there is no heat dissipation layer (i.e. metal body 9 for heat dissipation) below the lead.

It is also possible to form a reflector in advance and press-fix the reflector to the lead with an insulating adhesive sheet.

The lead frame 27 has a frame part 29, and the frame part 29 is cut in the position of the alternative long and short dash line in a post process. After the frame part 29 is cut, the first and second lead parts 2b and 5b become the first and second leads 2 and 5, respectively.

In the case of providing a photodiode chip for detecting a light output from the semiconductor light-emitting element chip, the photodiode chip can be die-bonded and wire-bonded to the lead frame 27 before the reflector 15 is formed. The photodiode chip may be die-bonded at a position where it is buried in the reflector 15. A portion of light from the semiconductor light-emitting element chip is not reflected by the reflection surface 15a but passes through the reflection surface 15a. Consequently, even when the photodiode chip is buried in the reflector 15, a light output from the semiconductor light-emitting element chip can be detected.

(2) Process of Fixing Metal Body for Heat Dissipation

Figure 5B:
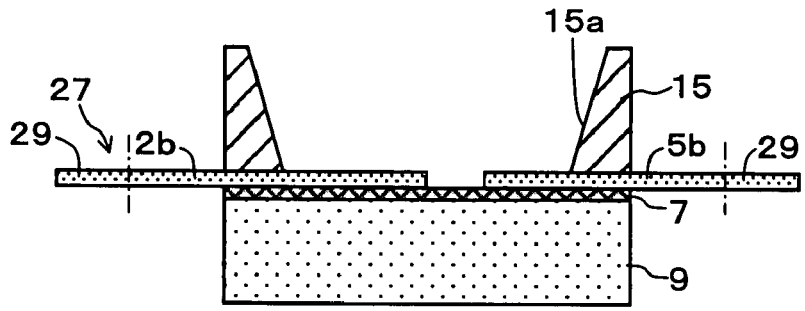

Next, the metal body 9 for heat dissipation is fixed to the lead frame 27 via the insulating adhesive layer 7, thereby obtaining the structure shown in FIG. 5B.

The metal body 9 for heat dissipation is a metal plate made of a metal (ex. aluminum or the like) having high heat conductivity. The metal body 9 for heat dissipation and the lead frame 27 can be fixed to each other by thermo-compression bonding with the insulating adhesive layer 7 made of an insulating adhesive sheet interposed therebetween. When the metal body 9 for heat dissipation and the lead frame 27 are thermo-compressed and bonded with an adhesive, a molten resin, or the like, the adhesive, molten resin, or the like may be pushed out. However, when the insulating adhesive sheet is used, such a pushing-out hardly occurs. As the insulating adhesive sheet, for example, a sheet obtained by forming an adhesive layer made of acrylic polymer or the like on each side of an insulating supporting layer made of polyester, polyvinyl chloride, or the like can be used. When the insulating adhesive sheet having the insulating supporting layer is used, the metal body 9 for heat dissipation and the lead frame 27 can be reliably insulated from each other, and occurrence of a short circuit between them can be prevented. The adhesive layers on both sides may be the same or different from each other. Such an insulating adhesive sheet is commercially available. For example, Model No. LE5004 manufactured by Lintec Corporation or Model No. GF-3600 manufactured by Hitachi Chemical Co., Ltd. can be used.

(3) Die Bonding, Wire Bonding, and Transparent Resin Filling Process

The semiconductor light-emitting element chip 3 is die-bonded to the first lead part 2b, and the chip 3 and the second lead part 5b are wire-bonded. The die bonding and the wire bonding are performed by means of the conductive adhesive layer 11 and the bonding wire 13, respectively.

Figure 5C:
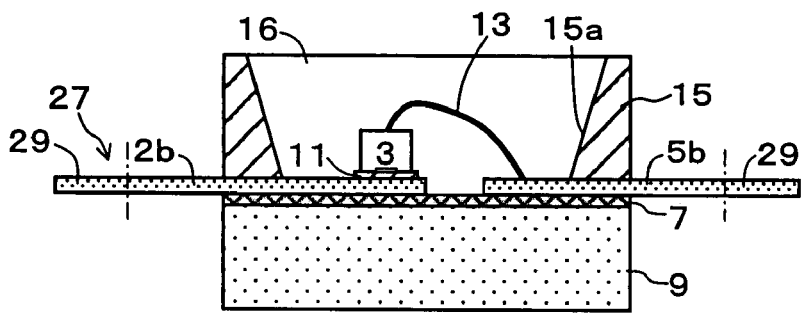

Next, the space on the inside of the reflector surface 15a of the reflector 15 is filled with the transparent resin 16, thereby obtaining the structure shown in FIG. 5C. The transparent resin 16 is an epoxy resin or the like.

(4) Process of Cutting First and Second Lead Parts

Figure 5D:
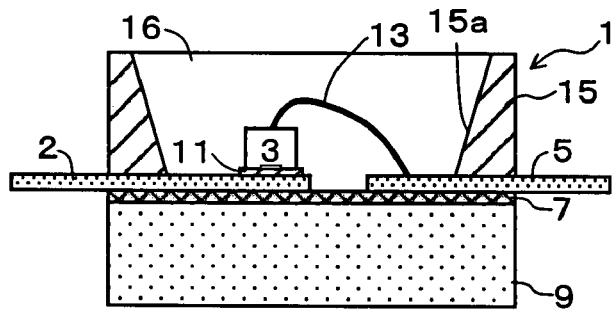

Subsequently, the frame part 29 is cut from the lead frame 27 to cut out the first and second lead parts 2b and 5b, thereby obtaining the semiconductor light-emitting element 1 having the first and second leads 2 and 5 shown in FIG. 5D.

5-2. Process of Manufacturing Semiconductor Light-Emitting Element Assembly

Next, a process of manufacturing the semiconductor light-emitting element assembly by attaching a wiring board and a heat dissipator to the semiconductor light-emitting element 1 will be described.

(1) Process of Attaching Wiring Board

Figure 5E:
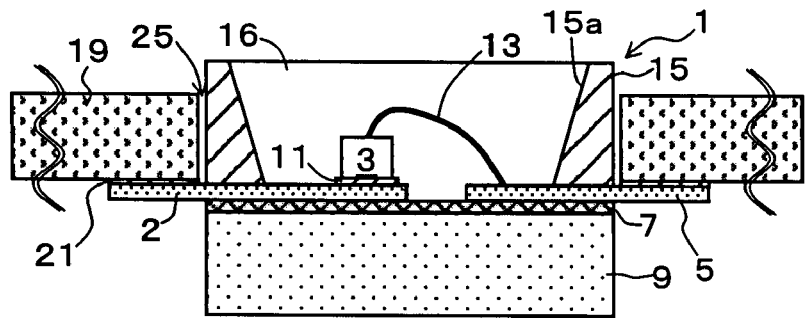
Figure 6:
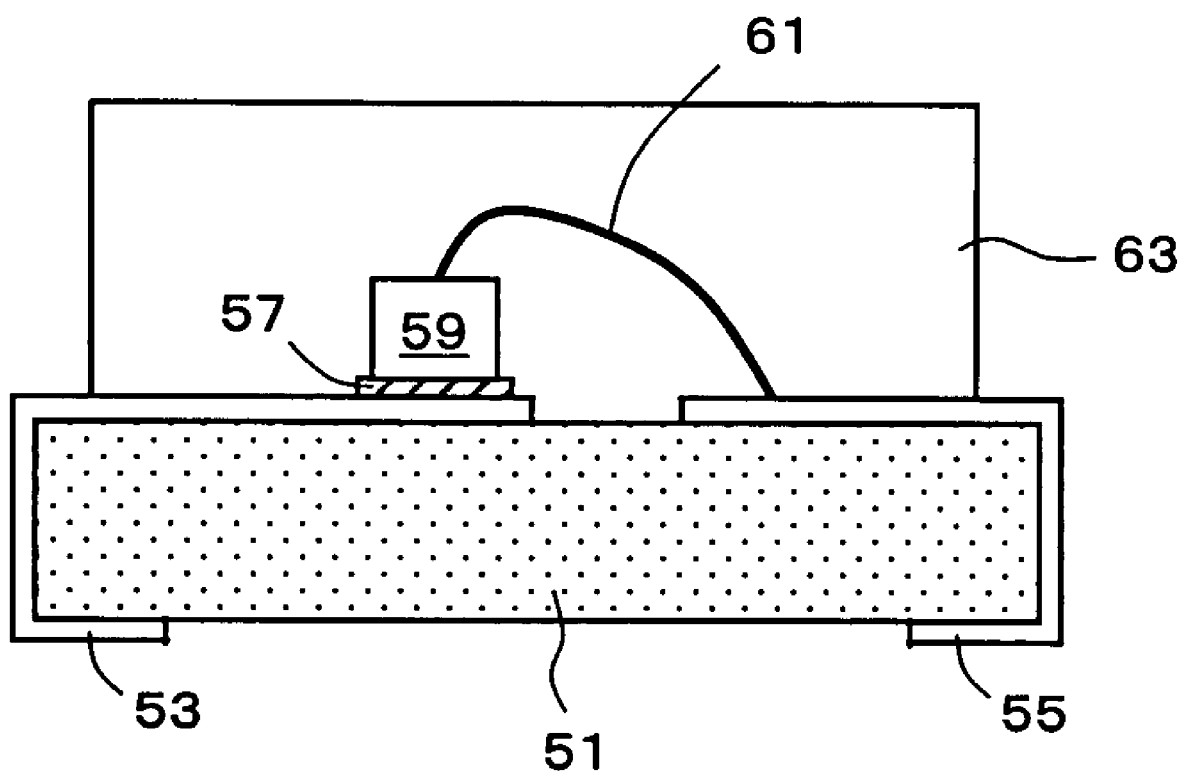
FIG. 6 shows a cross sectional view showing an example of a conventional semiconductor light-emitting element.

First, as shown in FIG. 5E, the wiring board 19 having the opening 25 is prepared. The semiconductor light-emitting element 1 is disposed so that the reflector 15 is received in the opening 25, and the first and second leads 2 and 5 of the semiconductor light-emitting element 1 are fixed to the wiring board 19 via the solder layer 21. At portions to which the first and second leads 2 and 5 are to be fixed in the wiring board 19, lands for fixing the first and second leads 2 and 5 are formed in advance.

(2) Process of Attaching and Fastening Heat Dissipator 11

Subsequently, as shown in FIGS. 1A to 1C, the heat dissipator 23 is disposed on the metal body 9 for heat dissipation, the heat dissipator 23 and the wiring board 19 are fastened by the fastening part 31, and the manufacturing of the semiconductor light-emitting element assembly is thus completed. According to the present embodiment, even when fastening by the fastening part 31 is too strong, due to the existence of the interval holding part which is the extension part 9a of the metal body 9 for heat dissipation, deformation of the first and second leads 2 and 5 is suppressed.

A plurality of semiconductor light-emitting elements 1 may be attached to the wiring board 19. In this case, by a method similar to the above described method, in each of the plurality of semiconductor light-emitting elements 1, the first and second leads 2 and 5 are fixed to the wiring board 19, the heat dissipator 23 is disposed on the metal body 9 for heat dissipation, and the heat dissipator 23 and the wiring board 19 are fastened by the fastening part 31. Alternatively, the heat dissipator 23 may be shared by the plurality of semiconductor light-emitting elements 1. In this case, in each of the plurality of semiconductor light-emitting elements 1, the first and second leads 2 and 5 are fixed to the wiring board 19, the shared heat dissipator 23 is disposed on the metal body 9 for heat dissipation in each of the semiconductor light-emitting elements 1, and the heat dissipator 23 and the wiring board 19 are fastened by the fastening part 31. Preferably, the fastening part 31 is provided for each of the semiconductor light-emitting elements 1.

The various features of the foregoing embodiments can be combined with one another. When a plurality of features are included in one embodiment, one or more features out of the plurality of features can be properly used alone or in combination and employed for the present invention.

What is claimed is:

1. A semiconductor light-emitting element assembly comprising:
    a semiconductor light-emitting element having first and second leads, a semiconductor light-emitting element chip die-bonded to the first lead and wire-bonded to the second lead, a metal body for heat dissipation fixed to the first and second leads via an insulating adhesive layer, and a reflector fixed to the first and second leads and reflecting light from the chip;
    a wiring board having an opening for receiving the reflector, the first and second leads being fixed to the wiring board so that the reflector is received in the opening;
    a heat dissipator disposed on the metal body for heat dissipation;
    a fastening part for fastening the heat dissipator and the wiring board; and
    an interval holding part provided between the heat dissipator and the wiring board, the interval holding part holding an interval between the heat dissipator and the wiring board so that the interval is equal to or longer than a predetermined distance.

2. The assembly of claim 1, wherein the interval holding part is formed of an extension part of the metal body for heat dissipation formed by extending the metal body for heat dissipation in the direction orthogonal to the direction in which the first and second leads extend.

3. The assembly of claim 1, wherein the interval holding part is formed of a spacer.

4. The assembly of claim 3, wherein the spacer is disposed between the fastening part and the metal body for heat dissipation.

5. The assembly of claim 1, wherein the semiconductor light-emitting element has a plurality of light-emitting modules each having first and second leads, a semiconductor light-emitting element chip die-bonded to the first lead and wire-bonded to the second lead; and
    the plurality of light-emitting modules are arranged along the direction orthogonal to the direction in which the first and second leads extend.

6. The assembly of claim 1, wherein the insulating adhesive layer is formed of an insulating adhesive sheet.

7. The assembly of claim 6, wherein the insulating adhesive sheet comprises an insulating supporting layer and an adhesive layer on each side of the insulating supporting layer.

* * * * *